(12) United States Patent
Palaniswamy et al.

(10) Patent No.: US 10,014,456 B2
(45) Date of Patent: Jul. 3, 2018

(54) FLEXIBLE CIRCUITS WITH COPLANAR CONDUCTIVE FEATURES AND METHODS OF MAKING SAME

(71) Applicant: 3M INNOVATIVE PROPERTIES COMPANY, St. Paul, MN (US)

(72) Inventors: Ravi Palaniswamy, Singapore (SG); Alejandro Aldrin Agcaoili Narag, II, Singapore (SG); Dong-Soo Lee, Seoul (KR); Dominic M. Travasso, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/128,500

(22) PCT Filed: Mar. 17, 2015

(86) PCT No.: PCT/US2015/021023
§ 371 (c)(1),
(2) Date: Sep. 23, 2016

(87) PCT Pub. No.: WO2015/148185
PCT Pub. Date: Oct. 1, 2015

(65) Prior Publication Data
US 2017/0179351 A1    Jun. 22, 2017

Related U.S. Application Data

(60) Provisional application No. 61/970,092, filed on Mar. 25, 2014.

(51) Int. Cl.
*H01L 33/00* (2010.01)
*H01L 33/62* (2010.01)
(Continued)

(52) U.S. Cl.
CPC ............ *H01L 33/62* (2013.01); *H01L 21/486* (2013.01); *H01L 21/4846* (2013.01);
(Continued)

(58) Field of Classification Search
None
See application file for complete search history.

(56) References Cited

U.S. PATENT DOCUMENTS 5,049,978 A    9/1991  Bates
7,012,017 B2   3/2006  Brunner
(Continued)

FOREIGN PATENT DOCUMENTS

JP    2003-209141    7/2003
TW    201349561     12/2013

OTHER PUBLICATIONS

International Search Report for PCT International Application No. PCT/US2015/021023, dated Jul. 9, 2015, 4pgs.

*Primary Examiner* — Minh-Loan Tran
(74) *Attorney, Agent, or Firm* — Clifton F. Richardson (57) ABSTRACT

Flexible LED assemblies that have coplanar integrated conductive features upon which an LED can be mounted, and methods of making such LED assemblies are described. The flexible LED assembly includes a flexible polymer substrate, a first conductive feature, a second conductive feature and an LED. The first conductive feature is positioned both within the flexible substrate and on a surface of the flexible substrate. The second conductive feature is positioned both within the flexible substrate and on a surface of the flexible substrate. The first and second conductive features are separated by a gap therebetween. The LED is mounted on both the first and second conductive features, and the first and second conductive features are substantially coplanar with one another.

18 Claims, 5 Drawing Sheets

(51) Int. Cl.
  *H01L 33/46*      (2010.01)
  *H01L 33/48*      (2010.01)
  *H01L 21/48*      (2006.01)
  *H01L 23/498*     (2006.01)
  *H01L 33/64*      (2010.01)

(52) U.S. Cl.
  CPC .... *H01L 23/4985* (2013.01); *H01L 23/49827* (2013.01); *H01L 33/46* (2013.01); *H01L 33/48* (2013.01); *H01L 33/483* (2013.01); *H01L 33/486* (2013.01); *H01L 33/64* (2013.01); *H01L 33/647* (2013.01); *H01L 2933/0033* (2013.01); *H01L 2933/0066* (2013.01)

(56) References Cited

U.S. PATENT DOCUMENTS

| | | |
|---|---|---|
| 7,393,557 B2 | 7/2008 | Fleming et al. |
| 2006/0131700 A1 | 6/2006 | David et al. |
| 2007/0020916 A1 | 1/2007 | Farnworth |
| 2007/0120089 A1 | 5/2007 | Mao et al. |
| 2007/0221935 A1 | 9/2007 | Tseng et al. |
| 2008/0225523 A1 | 9/2008 | De Samber |
| 2012/0068622 A1 | 3/2012 | Ward |
| 2012/0181560 A1 | 7/2012 | Hiramatsu et al. |
| 2013/0213697 A1 | 8/2013 | Palaniswamy |
| 2013/0320390 A1 | 12/2013 | Palaniswamy |
| 2014/0153263 A1 | 6/2014 | Palaniswamy |
| 2014/0264401 A1* | 9/2014 | Brooks .................. H01L 33/48 257/89 |
| 2015/0228869 A1* | 8/2015 | Yoo ........................ H01L 33/54 362/97.3 |

* cited by examiner

FLEXIBLE CIRCUITS WITH COPLANAR CONDUCTIVE FEATURES AND METHODS OF MAKING SAME

FIELD

The present invention relates to flexible LED assemblies that have co-planar integrated conductive features upon which an LED can be mounted, and to methods of making such LED assemblies.

BACKGROUND

Flexible circuits and assemblies are often used as connectors in various applications of electronics equipment, such as printers, computers, monitors and the like. Such circuits offer a benefit over previously used rigid circuit boards in both flexibility and space savings.

Where LEDs are attached to flexible circuits and assemblies, an attachment technique may be utilized. Various dies attachment techniques have been used for, e.g., flip chip dies, including eutectic bonding, which is attractive due to the need for less attachment material (and correspondingly, lower cost). This type of bonding generally takes place through inter-metallic bonding of gold and tin. However, despite the advantages of the bonding process, it requires a high level of coplanarity between adjacent conductors to which a common LED is being attached. This is a solution the present description provides.

SUMMARY

In one aspect, the present description relates to a flexible LED assembly. The flexible LED assembly includes a flexible polymer substrate, a first conductive feature, a second conductive feature and an LED. The first conductive feature is positioned both within the flexible substrate and also on a surface of the flexible substrate. The second conductive feature is positioned both within the flexible substrate and on a surface of the flexible substrate as well. The first and second conductive features are separated by a gap therebetween. The LED is mounted on both the first and second conductive features, and the first and second conductive features are substantially coplanar with one another.

In another aspect, the present description relates to a method of making a flexible LED assembly. The method includes the steps of providing a first substrate; applying a conductive metal layer on a first surface of the substrate; applying a resist to first areas of a surface of the conductive metal layer that is opposite the surface in contact with the first surface of the substrate, and to second areas of the second surface of the substrate, the first areas and second areas being different areas of the surfaces laterally; etching the areas of the conductive metal layer uncovered by the photo-resist until only a thin layer of the conductive metal layer remains in those areas; milling the second areas of the second surface of the substrate until the areas expose the conductive metal layer, creating vias in the substrate; removing the resist in first and second areas; filling the vias with conductive metal that is an equivalent metal to the conductive metal layers; and removing the thin layer of conductive metal layer remaining in the areas that were previously etched.

In yet another aspect, the present description relates to a second method of making a flexible LED assembly. The method includes the steps of providing a first substrate; applying a conductive metal layer on a first surface of the substrate; applying a film layer to the entire surface of the conductive metal layer that is opposite the surface in contact with the first surface of the substrate, and to the entire surface of the second surface of the substrate; removing portions of the film layer on both the conductive metal layer surface and second surface of the substrate; applying additional metal material over the areas of the conductive metal layer in those areas where the film layer has been removed; etching the areas of the substrate where the film has been removed until the areas expose the conductive metal layer, creating vias in the substrate; removing the remaining film on the conductive metal layer; filling the vias with conductive metal that is an equivalent metal to the conductive metal layers; and etching the portion of the conductive metal layer that had been positioned underneath the film until the conductive metal in the vias is exposed.

In another aspect, the present description relates to an article. The article includes a flexible dielectric polymer having a first major surface and a second major surface. The first major surface has a conductive layer thereon. The flexible dielectric polymer layer further includes two vias extending from the second major surface to the first major surface. The two vias contain conductive material. The conductive layer includes electrically separated first and second portions configured to support and electrically connect a light emitting semiconductor device to the conductive layer. Finally, the first and second portions are substantially coplanar with one another.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following detailed description of the preferred embodiments, reference is made to the accompanying drawings, which illustrate specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with," "stacked on" or "in contact with" another element, component or layer, it can be directly on, directly connected to, directly coupled with, directly stacked on, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, the term "coplanar" means that the planes of the two elements lie within 0 to 2 microns of one another.

Figure 1:
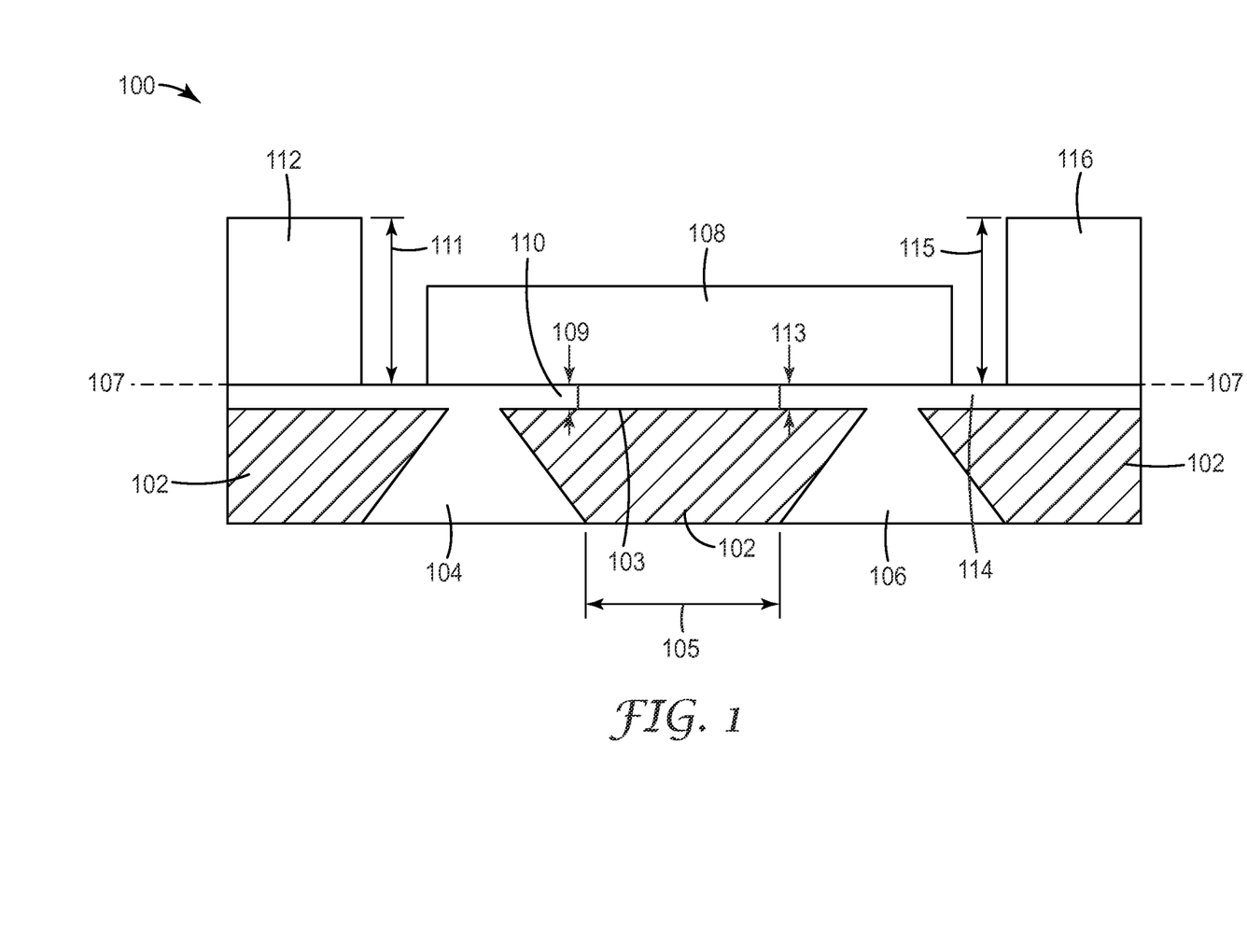
FIG. 1 is a cross-sectional view of a flexible LED assembly according to the present description.

FIG. 1 is a cross-sectional view of a flexible LED assembly 100 according to the present description. Flexible LED assembly 100 includes a flexible polymer substrate 102. In some embodiments, flexible polymer substrate may be comprised of polyimide. In other embodiments, flexible polymer substrate may be any other number of appropriate flexible polymers, including, but not limited to polyethylene terephthalate (PET), liquid crystalline polymer, polycarbonate, polyether ether ketone, or thermoplastic polymer. In preferred embodiments, flexible polymer will be a dielectric.

Flexible LED assembly 100 further includes a first conductive feature 104 that is positioned within the flexible substrate 102 and on a surface 103 of the flexible substrate. Flexible LED assembly also includes a second conductive feature 106 that is positioned both within flexible substrate 102 and on a surface 103 of the flexible substrate. First and second conductive features will generally be made of the same type of appropriate conductive metal. In a preferred embodiment, first and second conductive features 104 and 106 are made up of copper. The first and second conductive features are separated by a gap 105 positioned therebetween. An LED 108 is mounted on both the first conductive feature 104 and second conductive feature 106. Very importantly, the first and second conductive features are substantially coplanar with one another (see, e.g., plane 107 illustrated in FIG. 1).

In one embodiment, the first conductive feature 104 has a portion 110 that extends to a first height 109 above the surface of the flexible substrate 103, and a portion 112 that extends to a second height 111 above the surface of the flexible substrate. As illustrated, the second height 111 is substantially greater than the first height 109. The second height may generally be between about 30 microns and about 200 microns above surface 103. The first height may generally be between about 0 microns (i.e. no or nearly no extension above the surface) to a height of about 10 microns.

Similarly, the second conductive feature 106 has a portion 114 that extends to a third height 113 above the surface of the flexible substrate 103, as well as a portion 116 that extends to a fourth height 115 above the flexible substrate. The fourth height is substantially greater than the third height. Generally, the third height 113 of the second conductive feature is equal or nearly equal to the first height 109 of the first conductive feature. As such, third height may generally be between about 0 microns (i.e. no or nearly no extension above the surface) to a height of about 10 microns. The fourth height 115 of the second conductive feature may generally be equal to nearly equal to the second height 111 of the first conductive feature. As such, fourth height may generally be between about 30 microns and about 200 microns above surface 103.

Figure 2:
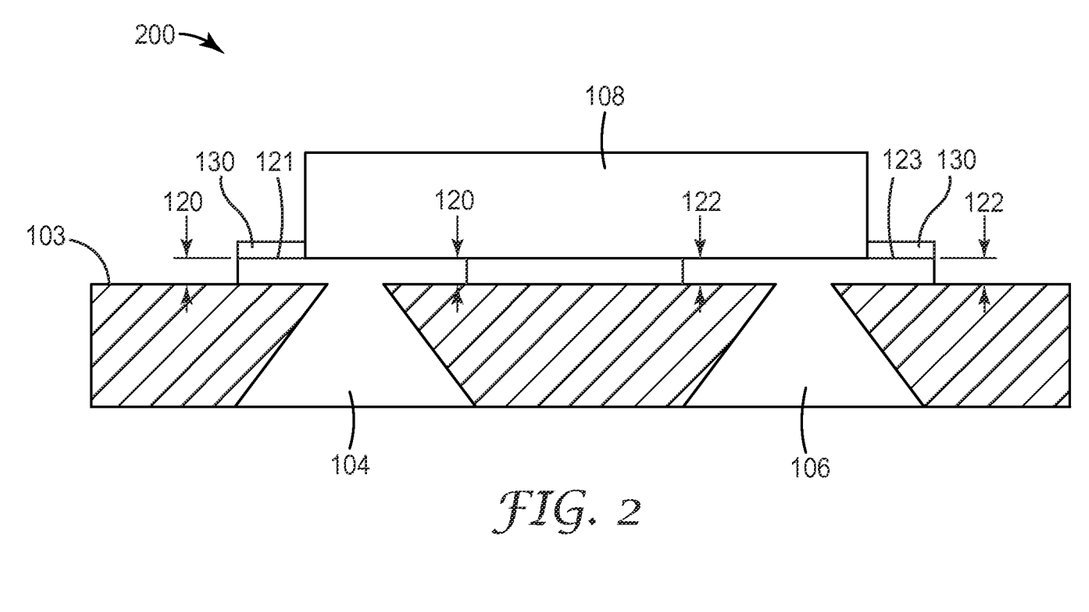
FIG. 2 is a cross-sectional view of a flexible LED assembly according to the present description.

In another embodiment, flexible LED assembly may not have varying heights across its surface. FIG. 2 illustrates such an embodiment, with flexible LED assembly 200. In this particular embodiment, first conductive feature 104 has a constant height 120 across the entirety of its top surface 121. The height 120 of the first conductive feature 104 may be between about 10 microns and about 50 microns. Similarly, the second conductive feature 106 has a constant height 122 across the entirety of its top surface (where height is measured from surface 103). The height of the second conductive feature 122 will, in preferred embodiments, be equal to the height of the first conductive feature 120. FIG. 2 also illustrates one potential feature that may be true of flexible LED assembly. A reflective coating 130 may be coated or otherwise provided on at least part of a surface (121, 123) of the first and second conductive features. In FIG. 1, such a coating could also be found on the sides and top of portions 112 and 116. In one particular embodiment, the reflective coating may be a white solder mask. Alternatively, the substrate 102 may be made of a reflective material and have reflective properties. A white polyimide substrate may be an appropriate material where such properties are present.

The LED 108 illustrated in the LED assembly 100 and 200 of FIGS. 1 and 2 may be any appropriate LED construction. In some embodiments, the LED may be a flip chip construction (a simplified version of which is illustrated in the figures). In other embodiments, the LED may be a lateral die. More generally, LED 108 may be any suitable type of light emitting semiconductor device. LED 108 may be attached to the first conductive feature 104 and second conductive feature 106 using appropriate bonding processes. However, the benefit of the coplanarity of the first and second conductive features is most strongly felt where the LED is eutectic bonded to the first and second conductive features. The coplanar nature optimizes electrical contact between the LED chip bond metal pad and the conductive features allowing for lower electrical resistance. It further optimizes physical contact between the two elements allowing for better thermal transfer.

Methods of making flexible LED assemblies such as those described above will now be described in greater detail. A flow chart of one method of making a flexible LED assembly is provided in FIG. 3. The method includes the first step of providing a first substrate 300. Substrate may be a flexible polymer substrate, such as a polyimide substrate, or the other flexible polymer substrates discussed above. In the next step, a conductive metal layer 310 is coated on a first surface 305 of the substrate. The conductive metal layer 310 may, in some embodiments, be applied using a sputtering and flash plating process.

Figure 3:
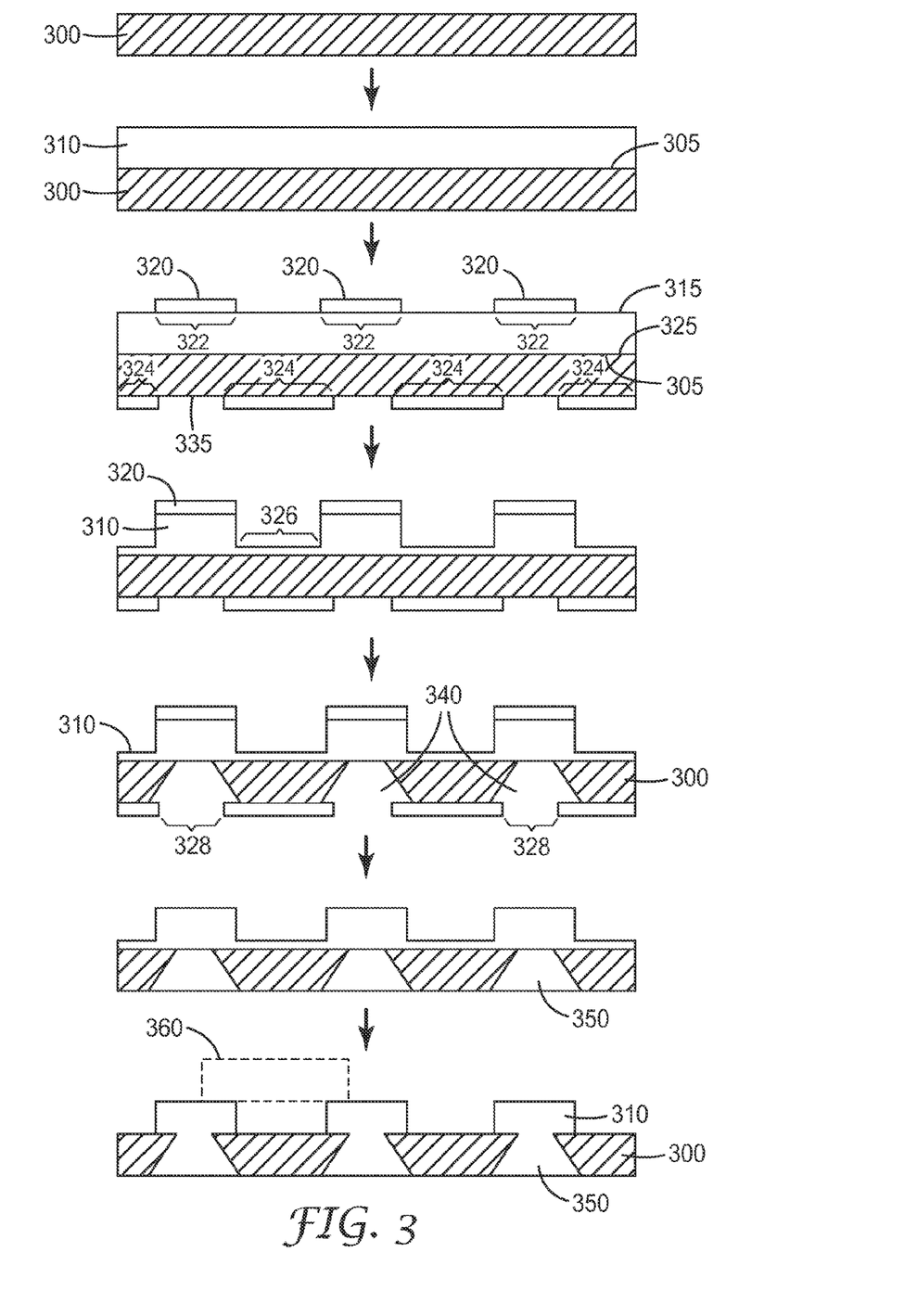
FIG. 3 is a flow chart of a method of making a flexible LED assembly according to the present description.

A resist 320 is then applied to first areas 322 of a surface 315 that is opposite the surface 325 in contact with the first surface of the substrate 305. Resist may be any appropriate resist, such as a photo-resist. Resist 320 is also applied to second areas 324 of the second surface 335 of the substrate. In some embodiments, as illustrated in FIG. 3, the first areas 322 and second areas 324 are different areas of the surface laterally (i.e. the areas do not co-exist at the same distances along the lateral width of the film stack).

Next, the areas of the conductive metal layer 310 that are uncovered by resist 320 are etched until only a thin layer of conductive metal layer 310 remains in those areas (see, e.g. area 326). Where resist 320 is a photoresist, etching may be achieved through a photolithography process. The second areas 328 of the second surface 335 of the substrate are then milled until the metal layer 310 is exposed, creating vias 340 in the substrate 300. The milling step may be performed using a chemical milling process. The resist 320 in the first area 322 and second area 324 may now be removed. Next, the vias 340 may be filled with conductive metal 350 that is an equivalent metal (e.g. copper) to the conductive metal layer 310. Finally, the thin layer of conductive metal layer remaining in the areas that were previously etched (those areas between areas 322), is removed. This thin layer may be removed by a number of appropriate methods, including flash etching the thin layer. Conductive metal layer 310 and conductive metal 350 filled in vias now act as common conductors where they are in contact with one another. In the final construction, as a result of using this method, the portions of the metal layer 310 that were originally masked (i.e. areas 322) are coplanar with one another in the final construction. As a final step, an LED 360 may be positioned on two adjacent conductors.

Figure 4:
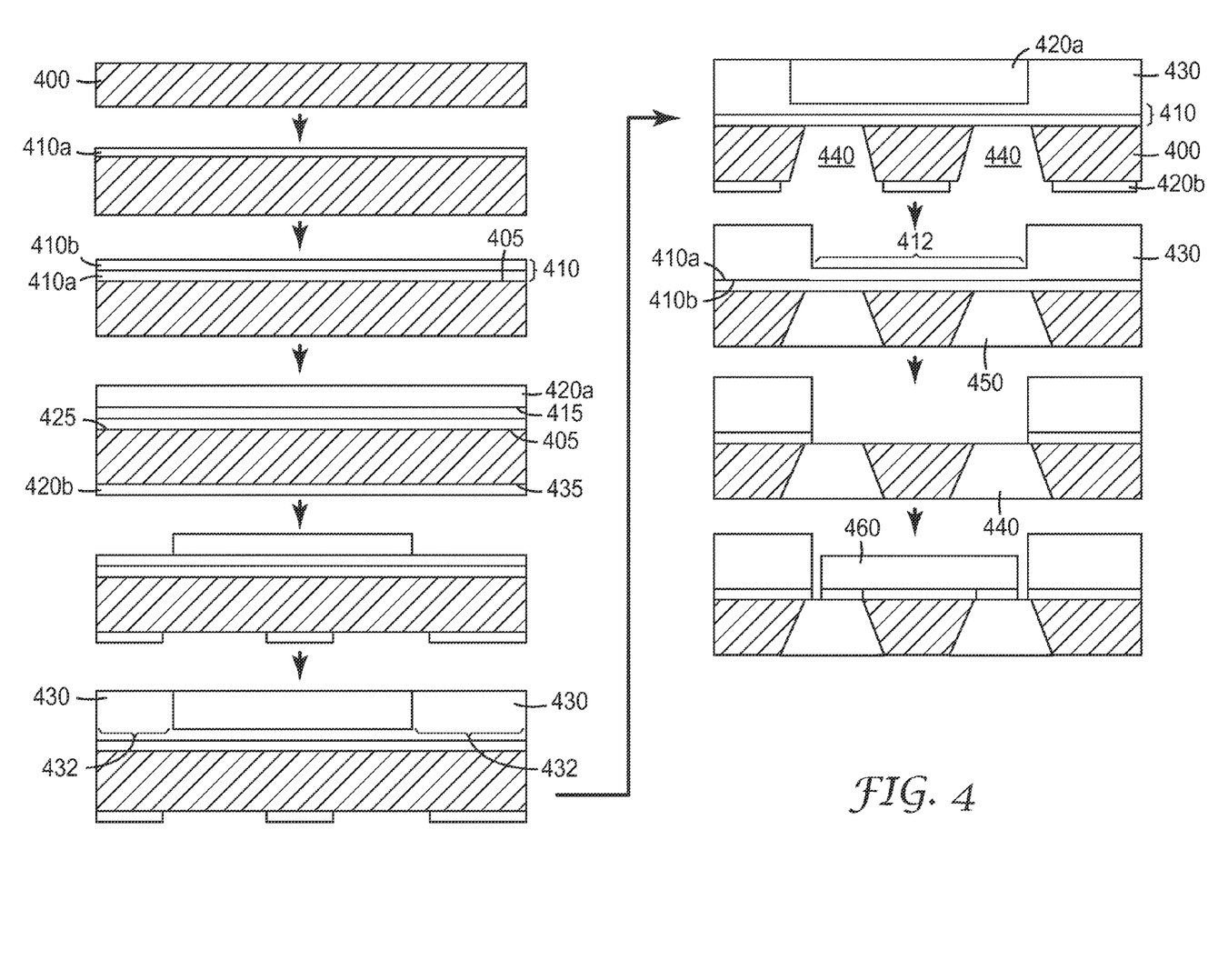
FIG. 4 is a flow chart of a method of making a flexible LED assembly according to the present description.

FIG. 4 illustrates a flow chart of an alternative method of making a flexible LED assembly. The method includes the steps of providing a first substrate 400. Again the substrate may be a flexible polymer layer, such as polyimide, or any of the other materials described with respect to flexible polymer substrate 102. Next, a conductive metal layer 410 is applied on a first surface of the substrate. The conductive metal layer may include sublayers 410a and 410b, each of which is applied separately. For example, first conductive metal sublayer 410a may be sputter coated onto the surface of substrate 400, and then conductive metal sublayer 410b may be flash plated on top of the sublayer 410a. This combination may be understood, however, as one step of applying a conductive metal layer 410 on a first surface 405 of the substrate 410.

Next, a film layer 420a is applied to the entire surface 415 of the conductive metal layer that is opposite the surface 425 in contact with the first surface of the substrate 405. Film layer 420b is also applied to the entire second surface of the substrate 435 (the second surface of the substrate being opposite the first surface). Portions of film layer 420a and 420b on both the conductive metal layer surface 415 and second surface of the substrate 435 are then removed. Next, additional metal material 430 is applied over the areas of the conductive metal layer 410 where the film layer had been removed. These areas are illustrated as areas 432.

The areas of the substrate 400 where the film 420b had been removed are then etched until the areas expose the conductive metal layer 410, creating vias 440 in the substrate 400. Next, the remaining film 420a on the conductive metal is removed, and the remaining film 420b on substrate 400 is removed. The vias 440 are then filled with conductive metal 450 that is an equivalent metal to the conductive metal layers 410a and 410b (collectively 410). In one embodiment the conductive metal used for metal layer 410 and to fill vias 440 is copper. Next, the portion of the conductive metal layer 412 that had been positioned underneath the film is etched until the conductive metal in the vias 440 is exposed. This etching process may be a flash etching process in one embodiment. As an optional final step, an LED 460 may be attached to the exposed conductive metal in the vias 440. As with the article described above, the LED 460 may be a flip chip or a lateral die. While eutectic bonding is contemplated, the LED may also be attached to the conductive metal in the vias by wire bonding.

Figure 5:
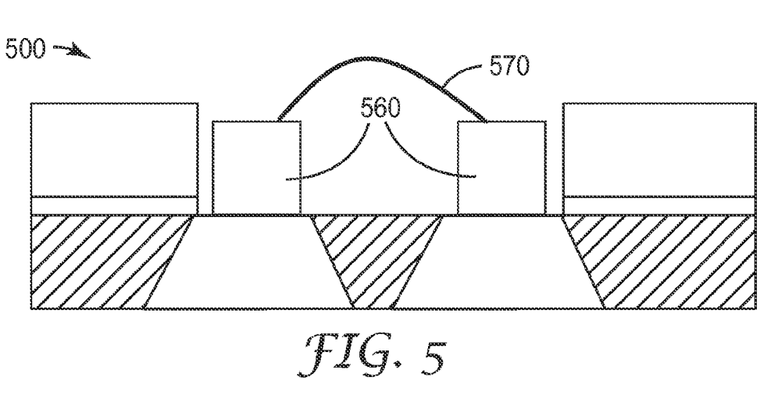
FIG. 5 is a cross-sectional view of a flexible LED assembly according to the present description.

FIG. 5 exemplifies a flexible LED assembly 500 on which LEDs 560 are electrically connected by wire bond 570. This offers an alternative to the flip chip construction illustrated in FIGS. 1 and 2.

Figure 6:
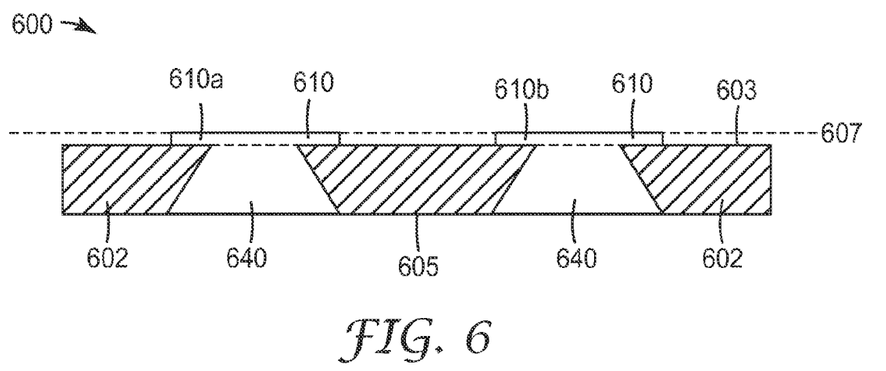
FIG. 6 is a cross-sectional view of an article according to the present description.

In an alternative aspect, the present description may be understood as simply an article upon which no LED has been attached. FIG. 6 illustrates such an article 600. Article 600 includes a flexible dielectric polymeric substrate 602 that has a first major surface 603 with a conductive layer 610 thereon. The substrate 602 may be made up of the materials described above with respect to substrate 102. The flexible dielectric substrate may further have a second major surface 605. Additionally, the flexible dielectric layer may have two vias 640 that contain conductive material (and may be the same material as the conductive layer 610, e.g. copper). The conductive layer may include electrically separated first and second portions 610a and 610b, where the separated portions are configured to support and electrically connect a light emitting semiconductor device to conductive layer 610 and conductive material in vias 640. The first and second portions 610a and 610b may be substantially coplanar with one another (see plane 607).

In other embodiments, the conductive material in the vias 640 may be the only conductive material present in the final construction, such that the conductive material in the vias 640 is coplanar with the substrate 602 and may allow for a flip chip die to connect to the conductive materials and be positioned flush with the substrate 602.

The following is a list of exemplary embodiments of the present description:

Embodiment 1 is a flexible LED assembly comprising;
    a flexible polymer substrate;
    a first conductive feature positioned both within the flexible substrate and on a surface of the flexible substrate;
    a second conductive feature positioned both within the flexible substrate and on a surface of the flexible substrate, the first and second conductive features separated by a gap therebetween; and
    an LED mounted on both the first and second conductive features, wherein the first and second conductive features are substantially coplanar with one another.

Embodiment 2 is the flexible LED assembly of embodiment 1, wherein the flexible polymer substrate comprises polyimide.

Embodiment 3 is the flexible LED assembly of embodiment 1, wherein the flexible polymer substrate comprises PET, liquid crystalline polymer, polycarbonate, polyether ether ketone, or thermoplastic polymer.

Embodiment 4 is the flexible LED assembly of embodiment 1, wherein the first and second conductive features comprise copper.

Embodiment 5 is the flexible LED assembly of embodiment 1, wherein the first conductive feature has a portion that extends to a first height above the surface of the flexible substrate and a portion that extends to a second height above the surface of the flexible substrate, the second height being substantially greater than the first height.

Embodiment 6 is the flexible LED assembly of embodiment 5, wherein the second height is between about 30 microns and about 200 microns.

Embodiment 7 is the flexible LED assembly of embodiment 5, wherein the first height is between about 0 microns and about 10 microns.

Embodiment 8 is the flexible LED assembly of embodiment 5, wherein the second conductive feature has a portion that extends to a third height above the surface of the flexible substrate and a portion that extends to a fourth height above the surface of the flexible substrate, the fourth height being substantially greater than the third height.

Embodiment 9 is the flexible LED assembly of embodiment 8, wherein the third height of the second conductive features is equal or nearly equal to the first height of the first conductive feature.

Embodiment 10 is the flexible LED assembly of embodiment 8, wherein the fourth height of the second conductive features is equal or nearly equal to the second height of the first conductive feature.

Embodiment 11 is the flexible LED assembly of embodiment 10, further comprising a reflective coating on at least part of the surface of the first and second conductive features.

Embodiment 12 is the flexible LED assembly of embodiment 1, wherein the first conductive feature has a constant height across the entirety of its top surface.

Embodiment 13 is the flexible LED assembly of embodiment 12, wherein the first conductive feature has a constant height of between about 10 microns and about 50 microns.

Embodiment 14 is the flexible LED assembly of embodiment 12, wherein the second conductive feature has a constant height across the entirety of its top surface, the height of the second conductive feature being equal or nearly equal to the height of the first conductive feature.

Embodiment 15 is the flexible LED assembly of embodiment 1, wherein the LED comprises a flip chip.

Embodiment 16 is the flexible LED assembly of embodiment 1, wherein the LED comprises a lateral die.

Embodiment 17 is the flexible LED assembly of embodiment 1, wherein the LED is eutectic bonded to the first and second conductive features.

Embodiment 18 is the flexible LED assembly of embodiment 1, wherein the flexible polymer substrate comprises a dielectric.

Embodiment 19 is a method of making a flexible LED assembly, comprising:
providing a first substrate,
applying a conductive metal layer on a first surface of the substrate,
applying a resist to first areas of a surface of the conductive metal layer that is opposite the surface in contact with the first surface of the substrate, and to second areas of the second surface of the substrate, the first areas and second areas being different areas of the surfaces laterally,
etching the areas of the conductive metal layer uncovered by the photo-resist until only a thin layer of the conductive metal layer remains in those areas,
milling the second areas of the second surface of the substrate until the areas expose the conductive metal layer, creating vias in the substrate,
removing the resist in first and second areas,
filling the vias with conductive metal that is an equivalent metal to the conductive metal layers, and
removing the thin layer of conductive metal layer remaining in the areas that were previously etched.

Embodiment 20 is the method of embodiment 19, wherein the first substrate comprises polyimide.

Embodiment 21 is the method of embodiment 19, wherein the conductive metal layer comprises copper.

Embodiment 22 is the method of embodiment 19, wherein the resist applied to the first areas of the first surface is a photo-resist, and etching comprises a photolithography process.

Embodiment 23 is the method of embodiment 19, wherein milling the second areas comprises chemical milling.

Embodiment 24 is the method of embodiment 19, wherein removing the thin layer comprises flash etching the thin layer.

Embodiment 25 is the method of embodiment 19, wherein the portions of the metal layer that were originally masked are coplanar with one another in the final construction.

Embodiment 26 is the method of embodiment 19, wherein conductive metal layer is applied using a sputtering and flash plating process.

Embodiment 27 is a method of making a flexible LED assembly, comprising:
providing a first substrate,
applying a conductive metal layer on a first surface of the substrate,
applying a film layer to the entire surface of the conductive metal layer that is opposite the surface in contact with the first surface of the substrate, and to the entire second surface of the substrate, the second surface being opposite the first surface,
removing portions of the film layer on both the conductive metal layer surface and second surface of the substrate,
applying additional metal material over the areas of the conductive metal layer in those areas where the film layer has been removed,
etching the areas of the substrate where the film has been removed until the areas expose the conductive metal layer, creating vias in the substrate,
removing the remaining film on the conductive metal layer,
filling the vias with conductive metal that is an equivalent metal to the conductive metal layers, and
etching the portion of the conductive metal layer that had been positioned underneath the film until the conductive metal in the vias is exposed.

Embodiment 28 is the method of embodiment 27, wherein the conductive metal layer is applied using a sputtering and flash plating process.

Embodiment 29 is the method of embodiment 27, wherein the conductive metal layer, additional metal material, and conductive metal applied in the via comprise copper.

Embodiment 30 is the method of embodiment 27, wherein etching the portion of the conductive metal layer that had been positioned underneath the film comprises a flash etching process.

Embodiment 31 is the method of embodiment 27, wherein the substrate comprises polyimide.

Embodiment 32 is the method of embodiment 27, further comprising the step of attaching an LED to the exposed conductive metal in the vias.

Embodiment 33 is the method of embodiment 32, wherein the LED comprises a flip chip.

Embodiment 34 is the method of embodiment 32, wherein the LED comprises a lateral die.

Embodiment 35 is the method of embodiment 32, wherein the LED is attached to the conductive metal by wire bonding.

Embodiment 36 is an article comprising:
a flexible dielectric polymeric substrate having a first major surface with a conductive layer thereon and having a second major surface, the flexible dielectric polymer layer having two vias extending from the second major surface to the first major surface, the two vias containing conductive material, the conductive layer including electrically separated first and second portions configured to support and electrically connect a light emitting semiconductor device to the conductive layer, wherein the first and second portions are substantially coplanar with one another.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

We claim:

1. A flexible LED assembly comprising;
a flexible polymer substrate;
a first conductive feature positioned both within the flexible substrate and on a surface of the flexible substrate;
a second conductive feature positioned both within the flexible substrate and on a surface of the flexible substrate, the first and second conductive features separated by a gap therebetween; and
an LED mounted on both the first and second conductive features, wherein the first and second conductive features are substantially coplanar with one another,.
wherein the first conductive feature has a portion that extends to a first height above the surface of the flexible substrate and a portion that extends to a second height above the surface of the flexible substrate, the second height being substantially greater than the first height.

2. The flexible LED assembly of claim 1, wherein the second height is between about 30 microns and about 200 microns.

3. The flexible LED assembly of claim 1, wherein the first height is between about 0 microns and about 10 microns.

4. The flexible LED assembly of claim 1, wherein the second conductive feature has a portion that extends to a third height above the surface of the flexible substrate and a portion that extends to a fourth height above the surface of the flexible substrate, the fourth height being substantially greater than the third height.

5. The flexible LED assembly of claim 1, wherein the flexible polymer substrate comprises polyimide.

6. The flexible LED assembly of claim 1, wherein the flexible polymer substrate comprises PET, liquid crystalline polymer, polycarbonate, polyether ether ketone, or thermoplastic polymer.

7. The flexible LED assembly of claim 1, wherein the first and second conductive features comprise copper.

8. The flexible LED assembly of claim 1, wherein the LED comprises a flip chip.

9. The flexible LED assembly of claim 1, wherein the LED comprises a lateral die.

10. The flexible LED assembly of claim 1, wherein the LED is eutectic bonded to the first and second conductive features.

11. A method of making a flexible LED assembly, comprising:
providing a substrate,
applying a conductive metal layer on a first surface of the substrate,
applying a resist to first areas of a surface of the conductive metal layer that is opposite the surface in contact with the first surface of the substrate, and to second areas of a second surface of the substrate, the first areas and second areas being different areas of the surfaces laterally,
etching the areas of the conductive metal layer uncovered by the resist until only a thin layer of the conductive metal layer remains in those areas,
milling the second areas of the second surface of the substrate until the areas expose the conductive metal layer, creating vias in the substrate,
removing the resist in first and second areas,
filling the vias with conductive metal that is an equivalent metal to the conductive metal layers, and
removing the thin layer of conductive metal layer remaining in the areas that were previously etched.

12. The method of claim 11, wherein milling the second areas comprises chemical milling.

13. The method of claim 11, wherein removing the thin layer comprises flash etching the thin layer.

14. The method of claim 11, wherein the conductive metal layer is applied using a sputtering and flash plating process.

15. A method of making a flexible LED assembly, comprising:
providing a substrate having a first surface and a second surface, the second surface being opposite the first surface,
applying a conductive metal layer on the first surface of the substrate,
applying a film layer to the entire surface of the conductive metal layer that is opposite the surface in contact with the first surface of the substrate, and to the entire second surface of the substrate,
removing portions of the film layer on both the conductive metal layer surface and second surface of the substrate,
applying additional metal material over the areas of the conductive metal layer in those areas where the film layer has been removed,
etching the areas of the substrate where the film has been removed until the areas expose the conductive metal layer, creating vias in the substrate,
removing the remaining film on the conductive metal layer,
filling the vias with conductive metal that is an equivalent metal to the conductive metal layers, and
etching the portion of the conductive metal layer that had been positioned underneath the film until the conductive metal in the vias is exposed.

16. The method of claim 15, wherein the conductive metal layer is applied using a sputtering and flash plating process.

17. The method of claim 15, wherein etching the portion of the conductive metal layer that had been positioned underneath the film comprises a flash etching process.

18. An article comprising:
a flexible dielectric polymeric substrate having a first major surface with a conductive layer thereon and having a second major surface, the flexible dielectric polymeric substrate having two vias extending from the second major surface to the first major surface, the two vias containing conductive material, the conductive layer including electrically separated first and second portions configured to support and electrically connect a light emitting semiconductor device to the conductive layer, wherein the first and second portions are substantially coplanar with one another, wherein the first portion of the conductive layer has a portion that extends to a first height above the surface of the substrate and a portion that extends to a second height above the surface of the substrate, the second height being substantially greater than the first height.

\* \* \* \* \*

UNITED STATES PATENT AND TRADEMARK OFFICE
CERTIFICATE OF CORRECTION

PATENT NO. : 10,014,456 B2  
APPLICATION NO. : 15/128500  
DATED : July 3, 2018  
INVENTOR(S) : Ravi Palaniswamy Page 1 of 1

It is certified that error appears in the above-identified patent and that said Letters Patent is hereby corrected as shown below:

In the Claims

Column 9
Line 45; In Claim 1, delete "another,." and insert -- another, --, therefor.

Signed and Sealed this
Nineteenth Day of February, 2019

Andrei Iancu
*Director of the United States Patent and Trademark Office*